(12) United States Patent
Varadarajan (10) Patent No.: US 12,147,697 B2
(45) Date of Patent: Nov. 19, 2024

(54) METHODS AND APPARATUS TO CHARACTERIZE MEMORY

(71) Applicant: Texas Instruments Incorporated, Dallas, TX (US)

(72) Inventor: Devanathan Varadarajan, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/900,551

(22) Filed: Aug. 31, 2022

(65) Prior Publication Data

US 2023/0229338 A1 Jul. 20, 2023

Related U.S. Application Data

(60) Provisional application No. 63/300,383, filed on Jan. 18, 2022.

(51) Int. Cl.
*G06F 12/00* (2006.01)
*G06F 3/06* (2006.01)

(52) U.S. Cl.
CPC .......... *G06F 3/0653* (2013.01); *G06F 3/0604* (2013.01); *G06F 3/0679* (2013.01)

(58) Field of Classification Search
CPC .... G06F 3/0653; G06F 3/0604; G06F 3/0679; G06F 11/1076; G11C 29/38; G11C 29/44
See application file for complete search history.

(56) References Cited

U.S. PATENT DOCUMENTS

| 4,782,487 | A | | 11/1988 | Smelser |
| 5,745,500 | A | * | 4/1998 | Damarla ............ G01R 31/2884 714/732 |
| 5,883,843 | A | | 3/1999 | Hii et al. |
| 5,923,599 | A | | 7/1999 | Hii et al. |
| 6,052,320 | A | * | 4/2000 | Kwak .................... G11C 29/28 365/201 |
| 6,353,563 | B1 | | 3/2002 | Hii et al. |
| 6,801,461 | B2 | | 10/2004 | Hii et al. |

(Continued)

OTHER PUBLICATIONS

Davanathan et al., "A Reconfigurable Built-in Memory Self-repair Architecture for Heterogeneous Cores with Embedded BIST Datapath", 2016 IEEE International Test Conference, Nov. 2016, 6 pages.

(Continued)

*Primary Examiner* — Shawn X Gu
*Assistant Examiner* — Mohammad S Hasan
(74) *Attorney, Agent, or Firm* — Xianghui Huang; Frank D. Cimino (57) ABSTRACT

An example device includes: converter circuitry having an output configured to couple to a first memory circuit from a plurality of memory circuits, the converter circuitry configured to: receive a first instruction formatted with a uniform protocol; and convert the first instruction from the uniform protocol to a protocol specific to the first memory circuit; logic circuitry having an input configured to couple to the first memory circuit, the logic circuitry configured to: receive a first result of the first instruction from the first memory circuit; and responsive to a second instruction, combine the first result with other results from ones of the plurality of memory circuits into an output.

20 Claims, 6 Drawing Sheets

(56) References Cited

U.S. PATENT DOCUMENTS

| | | | |
|---|---|---|---|
| 6,898,749 B2 | 5/2005 | Whetsel et al. | |
| 7,308,621 B2* | 12/2007 | Adams | G11C 29/42 |
| | | | 714/763 |
| 7,834,615 B2 | 11/2010 | Jarboe | |
| 8,667,260 B2 | 3/2014 | Eichenberger et al. | |
| 9,646,716 B2 | 5/2017 | Goessel et al. | |
| 10,600,495 B2 | 3/2020 | Varadarajan et al. | |
| 11,217,323 B1* | 1/2022 | Sharma | G11C 29/42 |
| 11,500,575 B2* | 11/2022 | Shin | G06F 3/0673 |
| 2003/0051197 A1* | 3/2003 | Evans | G11C 29/12 |
| | | | 714/718 |
| 2003/0222283 A1* | 12/2003 | Takazawa | G11C 29/26 |
| | | | 257/200 |
| 2005/0144525 A1 | 6/2005 | Heragu et al. | |
| 2005/0257107 A1 | 11/2005 | Kim | |
| 2006/0242521 A1 | 10/2006 | Hii et al. | |
| 2008/0098269 A1* | 4/2008 | Bhavsar | G01R 31/3187 |
| | | | 714/733 |
| 2008/0209294 A1 | 8/2008 | Brink et al. | |
| 2008/0235547 A1 | 9/2008 | Chan | |
| 2008/0320351 A1 | 12/2008 | Whetsel et al. | |
| 2009/0013228 A1 | 1/2009 | Jarboe, Jr. et al. | |
| 2009/0077441 A1 | 3/2009 | Huynh et al. | |
| 2009/0204861 A1* | 8/2009 | Cleavelin | G11C 29/44 |
| | | | 714/733 |
| 2010/0131748 A1* | 5/2010 | Lin | G06F 3/0679 |
| | | | 711/E12.001 |
| 2010/0229056 A1 | 9/2010 | Cleavelin et al. | |
| 2011/0026343 A1 | 2/2011 | Jarboe, Jr. et al. | |
| 2011/0176374 A1 | 7/2011 | Jarboe, Jr. et al. | |
| 2013/0275822 A1 | 10/2013 | Damodaran et al. | |
| 2014/0164856 A1 | 6/2014 | Damodaran et al. | |
| 2014/0189450 A1 | 7/2014 | Varadarajan et al. | |
| 2015/0067426 A1 | 3/2015 | Nardini et al. | |
| 2015/0235714 A1* | 8/2015 | Ko | G11C 29/26 |
| | | | 365/201 |
| 2016/0180966 A1* | 6/2016 | Lee | G11C 29/40 |
| | | | 714/719 |
| 2016/0365156 A1* | 12/2016 | Busi | G11C 29/18 |
| 2017/0125125 A1* | 5/2017 | Narayanan | G11C 29/40 |
| 2017/0157524 A1 | 6/2017 | Narayanan et al. | |
| 2018/0173651 A1* | 6/2018 | Xie | G06F 13/1689 |
| 2018/0374556 A1 | 12/2018 | Varadarajan et al. | |
| 2019/0138408 A1* | 5/2019 | Menon | G06F 11/184 |
| 2019/0227122 A1* | 7/2019 | Simpson | G11C 29/36 |
| 2020/0275137 A1* | 8/2020 | Chang | H04N 21/2355 |
| 2022/0068428 A1* | 3/2022 | Paik | G11C 29/10 |
| 2023/0211674 A1* | 7/2023 | Cronin | H02J 3/322 |
| | | | 320/103 |

OTHER PUBLICATIONS

International Search Report in corresponding PCT Application No. PCT/US2023/010020, mailed May 4, 2023.

International Search Report for PCT/US2023/037124, dated Mar. 21, 2024.

Pateras, Stephen, Electronic Design, "Nondestructive memory BIST for runtime automotive test", https://www.electronicdesign.com/technologies/test-measurement/article/21208496/nondestructive-memory-bist-for-runtime-automotive-test, Jun. 21, 2018, 10 pgs.

* cited by examiner

METHODS AND APPARATUS TO CHARACTERIZE MEMORY

CROSS-REFERENCE TO RELATED APPLICATION

This patent application claims the benefit of and priority to U.S. Provisional Patent Application Ser. No. 63/300,383 filed Jan. 18, 2022, which Application is hereby incorporated herein by reference in its entirety.

TECHNICAL FIELD

This description relates generally to fault detection, and more particularly to methods and apparatus to characterize memory.

BACKGROUND

Fault detection refers to the process of monitoring a device to determine the frequency, location, and type of faults that occur within the device. Fault detection is used on a variety of systems across multiple industries. In some examples of fault detection, a current state of a device may be recorded in a data structure known as a signature. In such examples, the signature that is recorded, measured, computed, etc. from the current state of the device is compared to an expected signature. Differences between the measured signature and the expected signature may be identified as faults in the device.

SUMMARY

For methods and apparatus to characterize memory, an example device includes converter circuitry having an output configured to couple to a first memory circuit from a plurality of memory circuits, the converter circuitry configured to: receive a first instruction formatted with a uniform protocol; and convert the first instruction from the uniform protocol to a protocol specific to the first memory circuit: logic circuitry having an input coupled to the first memory circuit, the first logic circuitry configured to couple to: receive a first result of the first instruction from the first memory circuit: and responsive to a second instruction, combine the first result with other results from ones of the plurality of memory circuits into an output

BRIEF DESCRIPTION OF THE DRAWINGS

The same reference numbers or other reference designators are used in the drawings to designate the same or similar (functionally and/or structurally) features.

DETAILED DESCRIPTION

The drawings are not necessarily to scale. Generally, the same reference numbers in the drawing(s) and this description refer to the same or like parts. Although the drawings show layers and regions with clean lines and boundaries, some or all of these lines and/or boundaries may be idealized. In reality, the boundaries and/or lines may be unobservable, blended and/or irregular.

In some examples, a current state of a device may be captured by computing a signature based on values stored in memory. A device may store a plurality of values in a variety of different memory circuits at any given time. A device may further implement one or more nodes, logic gates, or other communication paths, which may collectively be referred to as interconnect circuitry, to provide data from the memory circuits to processor circuitry. In some examples, the processor circuitry may be dedicated for fault detection functionality. The processor circuitry may perform the operations to test the device, access values from memory, and compute a signature based on the values. As used herein, fault detection circuitry refers to circuitry within a device whose primary function is to identify faults. Fault detection circuitry may include, but is not limited to, the interconnect circuitry and processor circuitry of the foregoing description.

Two metrics used to describe the quality of fault detection circuitry include computation time and implementation area. Computation time refers to both the amount of time interconnect circuitry requires to provide data from each of the desired memory circuits to the processor circuitry, and the amount of time for the processor circuitry to compute the signature. To identify faults, a device may run a test and compute a signature based on memory values that were changed due to the test. Because many tests interrupt the normal operation of a device, manufacturers aim to minimize the amount of time required to run the test, obtain the desired memory values, and compute a signature. Implementation area refers to the amount of die space required to implement fault detection functionality on an integrated circuit. In many examples, the fault detection circuitry may be embedded on an integrated circuit with other compute resources that may include, but are not limited to the various memory circuits, other types of processor circuitry, etc. Manufacturers may aim to minimize the implementation area designated for fault detection circuitry to reduce a build of materials, allocate die space for other compute resources, etc.

Fault detection circuitry may be designed in a number of ways. Some previous solutions to detect faults may use a centralized architecture. In the centralized architecture, a single instance of processor circuitry may compute a signature by obtaining and processing memory values from one group of memory values at a time. The processor circuitry may process additional groups of memory values sequentially. Previous solutions that use a centralized architecture may use minimal implementation area, as die space is only required for one processor circuitry instance and the corresponding interconnect circuitry. However, previous solutions that implement fault detection with a centralized architecture may have poor computation speed due to the sequential processing of groups of memory values.

Other previous solutions to detect faults may use a distributed architecture. In a distributed architecture, multiple processor circuitry instances compute portions of a signature. The portions of a signature may be combined into a completed, measured signature to compare against an expected signature. In some uses of distributed architecture, interconnect circuitry enables a given type of memory circuit to be accessed by a single instance processor circuitry. A given processor circuitry may in turn use interconnect circuitry to access values from one or more types of memory circuits. The number of types of memory accessed by a given processor circuitry instance may depend on the similarity of the memory types, the amount of compute resources available for fault detection, etc. Previous solutions that use a distributed architecture may exhibit low computation times compared to centralized architecture, as the multiple processor circuitry instances in a distributed architecture allow for multiple portions of the signature to be computed in parallel. However, previous solutions that use a distributed architecture may exhibit a higher implementation area than centralized architectures. Distributed architectures may be area intensive because die space is needed for each of the multiple processor circuitry instances, and or interconnect circuitry to enable multiple data path from the memory circuits to the multiple processor circuitry instances.

Example methods, apparatus, and systems described herein detect a fault in a manner that minimizes both computation time and implementation area. Advantageously, example fault detection circuitry described herein enables parallel access of memory values while also implementing a single instance of processor circuitry. Example fault detection circuitry described herein includes example Built In Self Test (BIST) circuitry, a type of processor circuitry dedicated to fault detection, which sends read instructions formatted with a uniform protocol to each of the various memory types. The example fault detection circuitry also includes example converter circuitry instances to convert the instruction into a format usable by the corresponding specific type of memory. The multiple memory circuits respond to the converted read instructions and provide memory values in parallel. Example interconnect circuitry within the fault detection circuitry includes first logic circuitry to prevent the processor circuitry from accessing the memory values unless a number of selected memory values satisfies a power safety threshold. The example interconnect circuitry further includes second logic gate circuitry to combine the multiple selected memory values into a single data path for the processor circuitry to access.

Figure 1:
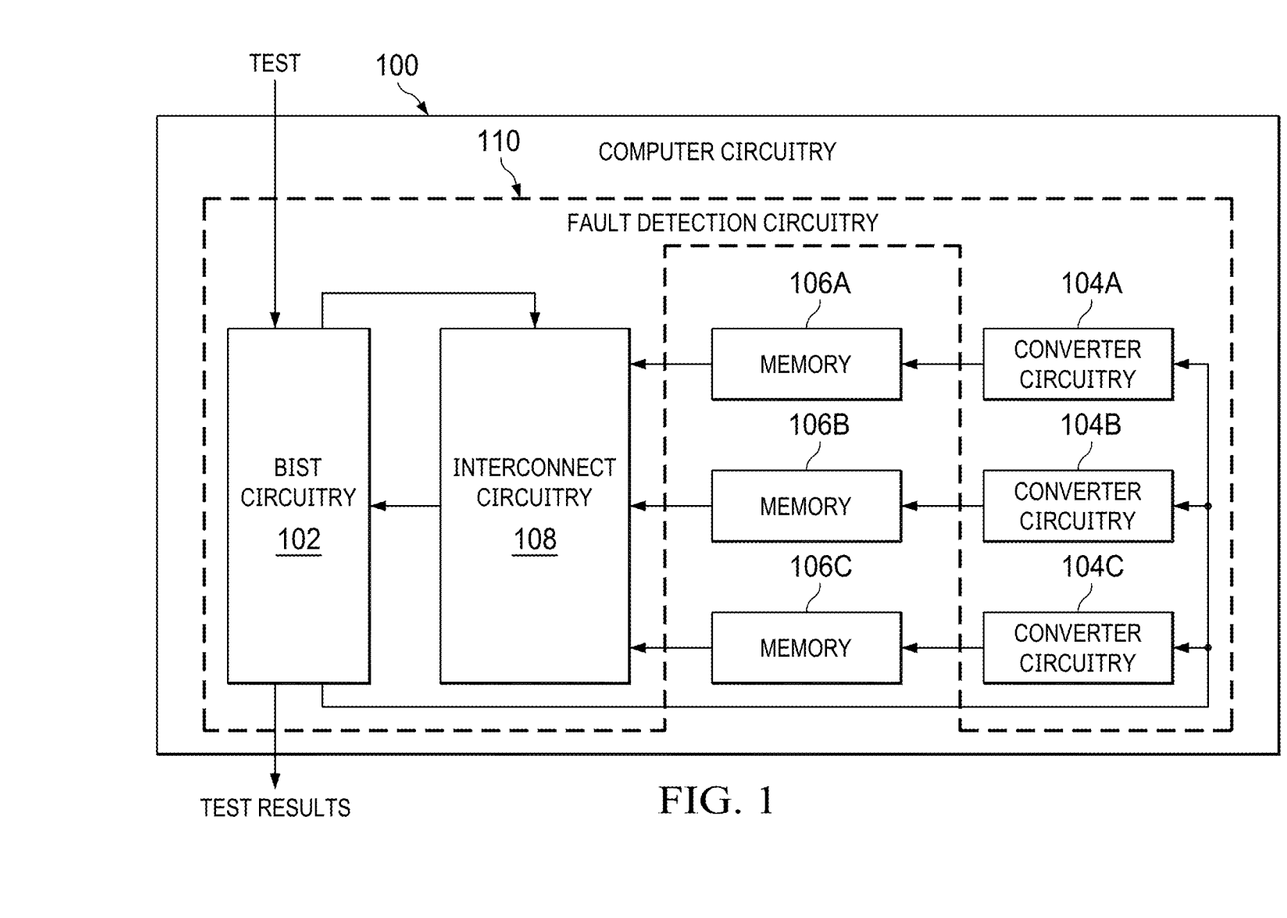
FIG. 1 is an example block diagram of computer circuitry.

FIG. 1 is an example block diagram of computer circuitry. The example computer circuitry 100 includes example BIST circuitry 102, example converter circuitry 104A, 104B, 104C, example memory 106A, 106B, 106C, and example interconnect circuitry 108.

The example computer circuitry 100 is an example of an electronic device that may contain faults. The faults may be identified as differences between measured memory values in the example memory 106A, 106B, 106C and expected memory values. The example computer circuitry 100 includes the BIST circuitry 102, converter circuitry 104C, and interconnect circuitry 108, which may be collectively referred to as example fault detection circuitry 110, to identify faults based on the contents of the example memory 106A, 106B, 106C, The example computer circuitry 100 may include additional components not illustrated in FIG. 1.

The example BIST circuitry 102 is a type of processor circuitry that controls the fault detection functionality within the example computer circuitry 100. The example BIST circuitry 102 may be implemented by any form of processor circuitry. For example, the BIST circuitry 102 may be implemented as one or more Field Programmable Gate Arrays (FPGAs) that may instantiate instructions, Central Processor Units (CPUs), Graphics Processor Units (GPUS), Digital Signal Processors (DSPs), or microcontrollers and integrated circuits such as Application Specific Integrated Circuits (ASICs).

The example BIST circuitry 102 may obtain a test from any source, including but not limited to an external device, other components of the computer circuitry 100, etc. The example test is non-destructive such that the values stored in the example memory 106A, 106B, 106C are the same both before and after the test. In some examples, the test only contains read operations to prevent modifications to the memory 106A, 106B, 106C and destruction of the previous memory values. In other examples, the test may contain both read and write operations. In such other examples, the example BIST circuitry 102 may provide instructions to the converter circuitry 104A, 104B, 104C, and to the interconnect circuitry 108 such that only memory values that were not overwritten by a write operation are included in the measured signature.

The example BIST circuitry 102 may obtain the results of the read operations from one or more of the example memory 106A, 106B, 106C from the example interconnect circuitry 108 and use the data to compute test results. In some examples, the test results may be a measured signature that another device will use for comparison. In other examples, the BIST circuitry 102 computes the measured signature, compares it to an expected signature, and the test results are used to identify faults within the computer circuitry 100. The example BIST circuitry 102 may share the test results with another device, provide the test results to a display, etc.

The example computer circuitry 100 includes one instance of example converter circuitry 104A, 104B, 104C for each type of memory 106A, 106B, 106C, The example converter circuitry 104A, 104B, 104C receive the read instructions from BIST circuitry 102 and covert the instruction from the uniform protocol to a format that is specific to the corresponding memory type. In some examples, if the uniform protocol matches the format used for the corresponding memory type, a given instance of converter circuitry 104A may not be required to convert formats of the received read instructions. Examples of uniform protocols and memory specific protocols are discussed further in connection with FIG. 2. The example converter circuitry 104A, 104B, 104C also enable backwards compatibility to fault detection use cases designed for centralized architectures. The example converter circuitry 104A, 104B, 104C are described further in connection with FIGS. 2 and 4.

The example memory 106A, 106B, 106C, are different types of memory circuits within the example computer circuitry 100. For example, each of the example memory 106A, 106B, 106C may be a volatile memory or a non-volatile memory. The volatile memory may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory may be implemented by flash memory and/or any other desired type of memory device.

Figure 3:
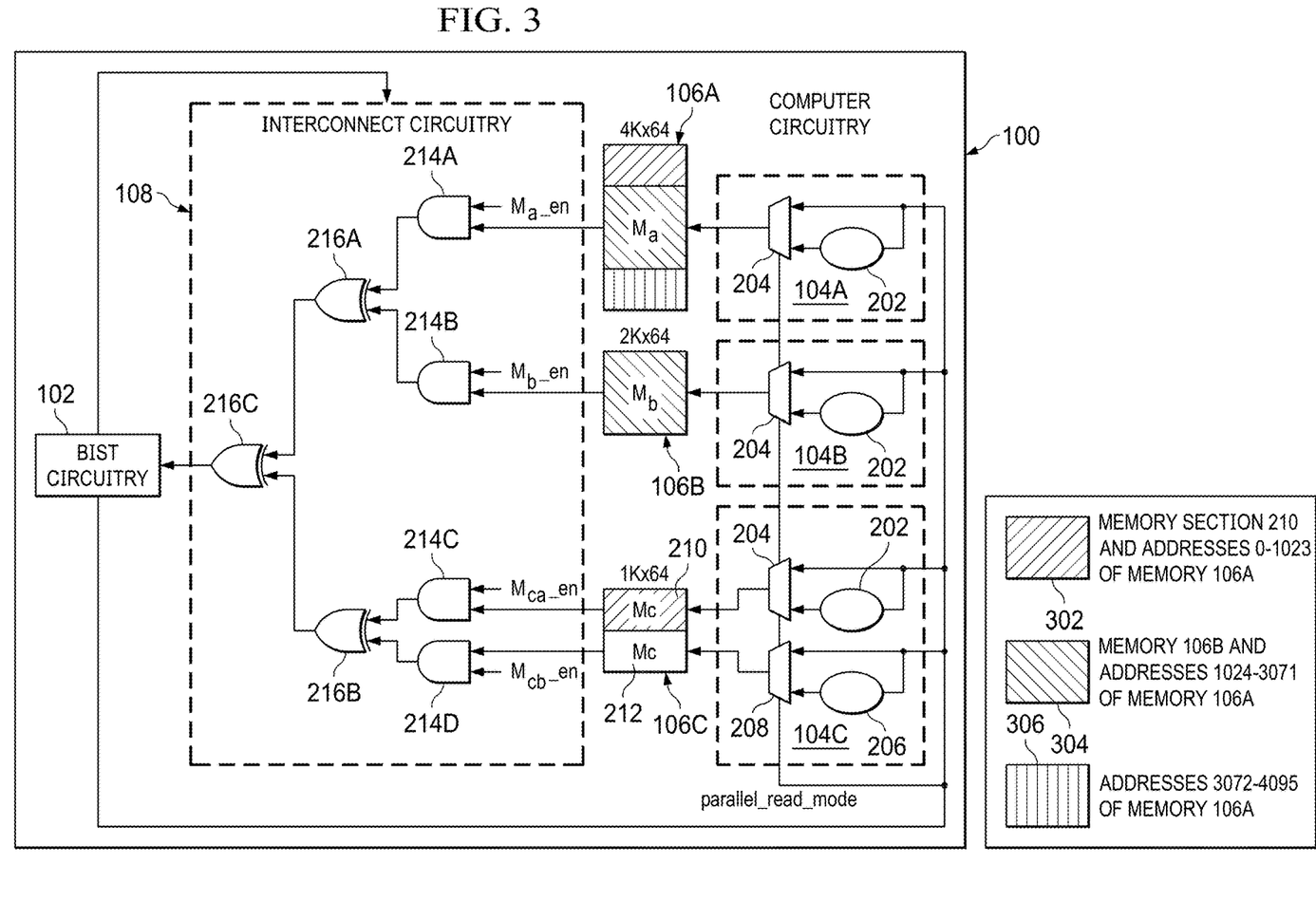
FIG. 3 is an illustrative example of power safety requirements in the computer circuitry of FIG. 1.

Each of the example memory 106A, 106B, 106C may store any amount of data. FIG. 3 illustrates three memory circuits, each of which have a different type, for simplicity.

In practice, the example computer circuitry 100 may have any number of memory circuits. Furthermore, in practice, some of the memory circuits may have different types, while other memory circuits use the same format to respond to the read instructions. The example memory 106A, 106B, 106C receive properly formatted read instructions from the example converter circuitry 104A, 104B, and 104C, respectively. In response to the read instructions, the example memory 106A, 106B, 106C provide memory values to the example interconnect circuitry 108.

The example interconnect circuitry 108 obtains the memory values from the example memory 106A, 106B, 106C, The example interconnect circuitry 108 also receives instructions from the BIST circuitry 102 that describe which of the memory values should be blocked to meet a power safety threshold. The example interconnect circuitry 108 blocks the corresponding memory values and combines the remaining memory values into a single data path connected to the BIST circuitry 102. The example interconnect circuitry 108 is discussed further in connection with FIGS. 2, 3.

The example computer circuitry 100 includes example fault detection circuitry 110 that is implemented according to the teachings of this disclosure. Advantageously, the example BIST circuitry 102 produces a single set of read instructions that, due to the converter circuitry 104A, 104B, 104C, can be obtained by each of the multiple types of memory 106A, 106B, 106C and responded to in parallel. The parallel processing decreases computation time of the example fault detection circuitry 110 in comparison to previous solutions that use a centralized architecture. Furthermore, the example the example BIST circuitry 102 is a single instance of a processor circuitry that computes a signature based off the multiple read values. In turn, the interconnect circuitry 108 only needs to implement a data path with a single endpoint. As a result, the example fault detection circuitry 110 requires less implementation area than previous solutions that use a distributed architecture.

Figure 2:
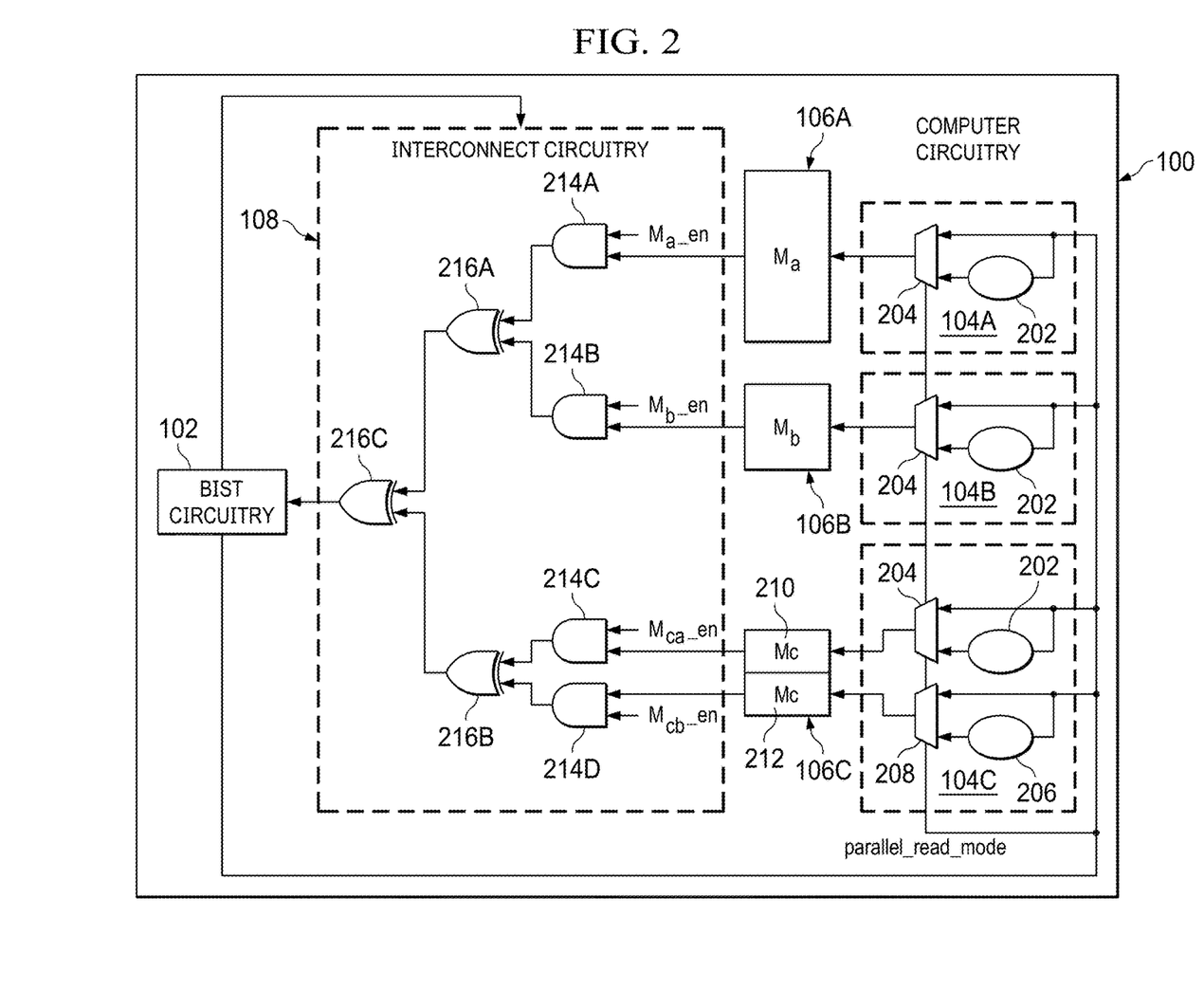
FIG. 2 is an example block diagram of the converter circuitry and interconnect circuitry of FIG. 1.

FIG. 2 is an example block diagram of the example converter circuitry 104A, 104B, 104C and example interconnect circuitry 108 of FIG. 1. FIG. 2 includes the example computer circuitry 100, which includes the example BIST circuitry 102, the example converter circuitry 104A, 104B, 104C, the example memory 106A, 106B, 106C, and the example interconnect circuitry 108. The example converter circuitry 104A, 104B, 104C include example format circuitry 202 and example multiplexer circuitry 204. The example converter circuitry 104C further includes example format circuitry 206 and example multiplexer circuitry 208. The example memory 106C includes example memory portions 210, 212. The example interconnect circuitry 108 includes example AND gates 214A, 214B, 214C, 214D, and example XOR gates 216A, 216B, 216C.

The example format circuitry 202 instances receive the read instruction(s) for signature generation formatted in the uniform protocol from the BIST circuitry 102. The example format circuitry 202 instances convert the read instruction(s) to a format that is specific to the corresponding type of memory 106A, 106B, 106C, For example, the uniform protocol sent by the BIST circuitry 102 may be designed for memory types with a single interface. In the illustrative example of FIG. 2, however, the example memory 106C has two interfaces. In some examples, an interface may be referred to as a port. A first port may obtain read and write requests for the example memory portion 210, and a second port may obtain read and write requests for the example memory portion 212. As a result, the example format circuitry 202 in the example converter circuitry 104C converts the read instructions from a single port format to a dual port format for the example memory portion 210. Similarly, the example format circuitry 206 in the example converter circuitry 104C converts the read instructions from a single port format to a dual port format for the example memory portion 212. In some such examples where the uniform instruction provided by the BIST circuitry specifies an address to be read, the format circuitry of the converter circuitry (e.g., format circuitry 202 or 206 of converter circuitry 104C) performs address translations on the address specified in the uniform instruction to determine an address to provide to the respective memory portion.

The example format circuitry 202 may convert formats other than those that relate to the number of ports on the example memory 106A, 106B, 106C, For example, when the BIST circuitry 102 executes a test that only includes read instructions, the uniform protocol format may be a Read Only Memory (ROM) format. A ROM format may inform a memory circuit that only read operations can be used when generating a response to the underlying instructions. Thus, a ROM format instruction provided by the BIST circuitry may specify an address and a read enable. However, some types of memory interfaces may support messages in a read and write format. A read and write format may inform a memory circuit that both read and write operations can be used when generating a response to the underlying instructions. In such examples, the example format circuitry 202 in one or more of the example converter circuitry 104A, 104B, 104C may convert the uniform protocol read instructions from a ROM format to a read and write format by providing disabling signals to inputs of the respective memory associated with writing, such as write data and/or write enable inputs.

The example multiplexer circuitry 204, 208 instances receive the converted instruction with a memory specific format at a first input. The example multiplexer circuitry 204, 208 instances also receive the read instructions in its original format (e.g., uniform protocol format) directly from the example BIST circuitry 102 at a second input. The example multiplexer circuitry 204, 208 instances provide one of the two formatted instructions to a corresponding example memory 106A, 106B or corresponding example memory portion 210, 212 based on a control signal from the BIST circuitry 102. In examples described in connection with FIGS. 1, 2, 3, the example multiplexer circuitry 204, 208 instances provided the converted instructions with a memory specific format to two or more of the example memory 106A, 106B, 106C, In such examples, the example fault detection circuitry 110 may be referred to as in a parallel read mode.

When the example BIST circuitry 102 instructs only one of the example multiplexer circuitry 204, 208 instances to provide a memory specific read instructions to one of the example memory 106A, 106B, 106C, the example fault detection circuitry 110 may be referred to as in a backwards compatibility mode. Backwards compatibility is discussed further in connection with FIG. 4.

The example AND gates 214A, 214B, 214C, 214D are circuitry that perform logical AND operations. The example AND gates 214A, 214B, 214C, 214D each have two inputs. The first input of each of the example AND gates 214A, 214B, 214C, 214D is coupled to one type or port of memory. For example, example AND gate 214B receives an input from example memory 106B, example AND gate 214C receives an input from example memory portion 210, etc. The second input of each of the example AND gates 214A, 214B, 214C, 214D is a control signal sent by the BIST circuitry 102. The control signals sent by the BIST circuitry 102 include either a high supply voltage (i.e., a logical '1' bit) or a low supply voltage (i.e., a logical '0' bit). When a given AND gate (such as example AND gate 214A) receives a control signal with a '1' bit from the BIST circuitry 102, values from the corresponding memory (such as example memory 106A) are forwarded to the corresponding XOR gate (such as example XOR gate 216A). Alternatively, when a given example AND gate receives a control signal with a '0' bit from the BIST circuitry 102, the AND gate prevents values from the corresponding memory from reaching the corresponding XOR gate. As such, for any given set of read instruction results generated in parallel by the example memory 106A, 106B, 106C, the subset of results that the example AND gates 214A, 214B, 214C, 214D provides to the example XOR gates 216A, 216B, 216C is separate from and mutually exclusive to the subset of results that the example AND gates 214A, 214B, 214C, 214D prevent from reaching the example XOR gates 216A, 216B, 216C.

The example XOR gates 216A, 216B, 216C are circuitry that perform logical exclusive OR computation. That is, a given XOR gate 216A only outputs a '1' bit if one of its inputs is a '1' bit and the other input is a '0' bit. If both of the inputs of a given XOR gate 216A are '0' bits, or if both inputs are '1' bits, the example XOR gate 216A outputs a '0' bit.

The output of the example XOR gates 216A, 216B, 216C may depend on the control signals sent to the example AND gates 214A, 214B, 214C, 214D. For example, suppose example AND gates 214A, 214B both received a '1' bit control signal from the BIST circuitry 102. As a result, the example XOR gate 216A may receive a first sequence of '1' and '0' bits representative of the response to the read operation by the example memory 106A at its first input. The example XOR gate 216A may also receive a second sequence of '1' and '0' bits representative of the response to the read operation by the example memory 106B at its second input. As such, the example XOR gate 216A outputs a sequence of '1' bits and '0' bits in which a '0' bit indicates the first and second sequence store the same bit at a particular index, and a '1' bit indicates the first and second sequence store different bits at a particular index. As an additional example, suppose the example AND gate 214C receives a '1' bit control signal from the BIST circuitry 102, and the example AND gate 214D receives a '0' bit control signal from the BIST circuitry 102. In such examples, the output of the example XOR gate 216B would match that of the response to the read operation by the example memory portion 210. The example XOR gate 216C performs the logical exclusive operation on the outputs of the example XOR gates 216A, 216B, and provides the results to the example BIST circuitry 102.

While the example block diagram of FIG. 2 illustrates the example interconnect circuitry 108 as four AND gates and three XOR gates, in practice, a different number of logic gates may be used. The number of gates may depend on the number of memory types within the example computer circuitry 100, and the number and types of gates selected may determine the interconnect output produced by the final gate (e.g., XOR 216C) and used to generate a signature for a given test.

The example block diagram of FIG. 2 illustrates how the example converter circuitry 104A, 104B, 104C and example interconnect circuitry 108 are implemented. Advantageously, the example converter circuitry 104A, 104B, 104C includes example format circuitry 202, 206 that enables the BIST circuitry 102 to send a single uniform read operation, eliminating any need for a processor to generate multiple, memory specific read operations in sequence and thereby reducing computation time. Furthermore, the example interconnect circuitry 108 includes example AND gates 214A, 214B, 214C, 214D so that the BIST circuitry 102 can block certain memory values and satisfy a power safety threshold.

The example block diagram also shows how the example interconnect circuitry 108 implements space compaction in the example XOR gates 216A, 216B, 216C by providing a smaller amount of data to the BIST circuitry 102 than was received from the multiple parallel read responses. For example, suppose every AND gate 214A, 214B, 214C, 214D received a logical '1' control signal from the BIST circuitry 102, and that each of the memory 106A, 106B, and each of the memory portions 210, 212, provided one byte of data in response to the memory specific read operation. In such an example, the XOR gates 216A, 216B, would collectively receive a total of 32 bits of data from the memory 106A, 106B, 106C, but the XOR gate 216C would output eight bits of data that correspond to the differences between the multiple responses of the read operation. Such a reduction of data enables a single instance of the example BIST circuitry 102 to compute the entire signature, as opposed to multiple instances that each compute a portion of the signature. As a result, the example interconnect circuitry 108 enables a smaller amount of die space to be used to implement the fault detection circuitry 110.

FIG. 3 is an illustrative example of power safety requirements in the computer circuitry of FIG. 1. FIG. 3 includes the example computer circuitry 100 and example memory activation periods 302, 304, 306. The example computer circuitry 100 includes the example BIST circuitry 102, the example converter circuitry 104A, 104B, 104C, the example memory 106A, 106B, 106C, and the example interconnect circuitry 108. The example converter circuitry 104A, 104B, 104C include the example format circuitry 202 and the example multiplexer circuitry 204. The example converter circuitry 104C further includes the example format circuitry 206 and the example multiplexer circuitry 208. The example memory 106C includes example the memory portions 210, 212. The example interconnect circuitry 108 includes the example AND gates 214A, 214B, 214C, 214D, and the example XOR gates 216A, 216B, 216C.

In some examples, the computer circuitry 100 may implement a power safety threshold. As used above and herein, a power safety threshold refers to the number of read or write operations that the example memory 106A, 106B, 106C can perform in parallel. The example computer circuitry 100 may implement the power safety threshold because the act of performing a read or write operation may be a power intensive process that may become suboptimal and/or unsafe if too many memory circuits perform operations simultaneously. In the illustrative example of FIG. 3, the computer circuitry 100 implements a power safety threshold such that no more than two read or write operations can occur at any given time.

The example memory 106A, 106B, 106C include valid identifier patterns so that the BIST circuitry 102 can send a uniform protocol instruction to all memories and simultaneously ensuring only a given number of memory circuits respond to the instruction at a given point in time. As used herein, a valid identifier pattern refers to metadata that describes which instructions are valid for a particular memory. A manufacturer may assign a valid identifier pattern to each example memory 106A, 106B, 106C in the example computer circuitry 100. Different memories may have overlapping identifier patterns. In one example, a valid identifier pattern may be an acceptable address range pattern. Different memories may have overlapping valid addresses. An example memory 106A receives a converted instruction and determines whether the instruction identifier (such as the address) matches with the valid identifier pattern (such as the valid address range). If the instruction identifier and valid identifier pattern matches, the example memory 106A is enabled and generates a response to the converted instruction. If the instruction identifier does not match the valid identifier pattern, the example memory 106A ignores the instruction. To ensure parallelism, multiple memories may satisfy the valid identifier pattern for a given instruction identifier. As described above, in some examples, each of memory 106A, 106B, and 106C determines whether an instruction identifier matches a valid identifier pattern. Additionally or in the alternative, the respective converter circuitry (e.g., converter circuitry 104A, 104B, or 104C) determines whether an instruction identifier matches a valid identifier pattern associated with the respective memory and only forwards those instructions that match the valid identifier pattern to the respective memory.

To ensure the power safety threshold is satisfied at all times, the instructions match the valid identifiers of only a subset of memories within the example computer circuitry 100 at any point in time. For example, while the BIST circuitry 102 broadcasts the uniform protocol read instructions to all the converter circuitries 104A, 104B, 104C at once, the ones of the example memory 106A, 106B, and example memory portions 210, 212 that do not satisfy the valid identifier pattern would not perform operations, while the memory components that do satisfy the valid identifier pattern would perform one or more sequential read operations. The example BIST circuitry 102 may determine which memory components to enable for the read instructions based on a schedule determined by the BIST circuitry 102. Similarly, the example AND gates 214A, 214B, 214C, 214D compare a received instruction identifier sent by the BIST circuitry 102 to a valid identifier pattern for each memory component and, based on the schedule, only enable the output of memory components that satisfy the valid identifier pattern to be provided to the example XOR gates 216A, 216B, 216C, In doing so, the example AND gates 214A, 214B, 214C, 214D prevent any type of output from a memory component that was not identified by the valid identifier pattern, and therefore not actively computing a result of a read instruction, from being included in the measured signature computation.

In the illustrative example of FIG. 3, the example memory 106A includes 4096 memory addresses, the example memory 106B includes 2048 memory addresses, and each of the example memory portions 210, 212 include 1024 memory addresses. Furthermore, the example illustrative example of FIG. 3, the BIST circuitry 102 does not require memory values from the memory portion 212. The example BIST circuitry 102 may not require values from one or more types or portions of memory if the one or more types or portions of memory were not influenced by the test.

The example BIST circuitry 102 schedules the memory operations into three memory activation periods. During each activation period, only two types of the memory 106A, 106B, 106C are performing read operations, thus satisfying the power safety threshold set by the computer circuitry 100. In the example memory activation period 302, the example BIST circuitry 102 provides read instructions to the example memory 106A and the example memory portion 210 via the corresponding converter circuitry 104A, 104C, The example BIST circuitry 102 also provides '1' bits to AND gates 214A, 214C, while providing '0' bits to AND gates 214B, 214D during the example memory activation period 302. The example memory portion 210 performs read operations to sequentially provide the values of all 1024 memory addresses to the example AND gate 214C during the example memory activation period 302. At the same time, the example memory 106A also performs read operations and provides values from memory addresses 0-1023 to example AND gate 214A, During the example memory activation period 302, the example XOR gates 216A, 216B also forwards the respective results to the example XOR gate 216C, which compresses the results by performing a logical exclusive OR operation and provides the results to the example BIST circuitry 102.

The example memory activation period 302 ends once the 1024 addresses in the memory portion 210 have been read. In the schedule of the illustrative example of FIG. 3, the example memory activation period 302 is followed by the example memory activation period 304. During the example memory activation period 304, the example BIST circuitry 102 provides read instructions to the example memory 106A and the example memory 106B via the corresponding converter circuitry 104A, 104B, The example BIST circuitry 102 also provides '1' bits to AND gates 214A, 214B, while providing '0' bits to AND gates 214C, 214D during the example memory activation period 304. The example memory portion 210 performs read operations to sequentially provide the values of all 2048 memory addresses to the example AND gate 214B during the example activation period 304. At the same time, the example memory 106B also performs read operations and provides values from memory addresses 1024-3071 to example AND gate 214A, During the example activation period 304, the example XOR gates 216A, 216B also forwards the respective results to the example XOR gate 216C.

The example memory activation period 304 ends once the 2048 addresses in the memory 106B have been read. In the schedule of the illustrative example of FIG. 3, the example memory activation period 304 is followed by the example memory activation period 306. During the example memory activation period 304, the example BIST circuitry 102 provides read instructions to the example memory 106A, provides a '1' bit to the AND gate 214A, and provides '0' bits to example AND gates 214B, 214, 214D. The example memory 106A performs read operations to sequentially provide the values of all the remaining 1024 memory addresses (i.e., addresses 3072-4095) to the example AND gate 214A during the example activation period 304. The example memory portions 212 does not perform read operations during the example memory activation period 306 or any part of the schedule because, in the illustrative example of FIG. 3, the example BIST circuitry 102 does not require values from the memory portion 212 for signature computation. However, if the example computer circuitry 100 was implemented with example memory 106D that was required for signature computation, the first 1024 memory addresses of example memory 106D would be read during the example memory activation period 306.

FIG. 3 shows how the example BIST circuitry 102 ensures that any power safety threshold set by the computer circuitry 100 is satisfied when obtaining memory values for signature computation. Advantageously, the example BIST circuitry 102 gives instructions to the example converter circuitry 104A, 104B, 104C, and example interconnect circuitry 108 on a schedule to ensure the read operations are still computed in parallel as much as possible. As such, the example fault detection circuitry 110 both minimizes computation time and complies with system level power requirements.

Figure 4:
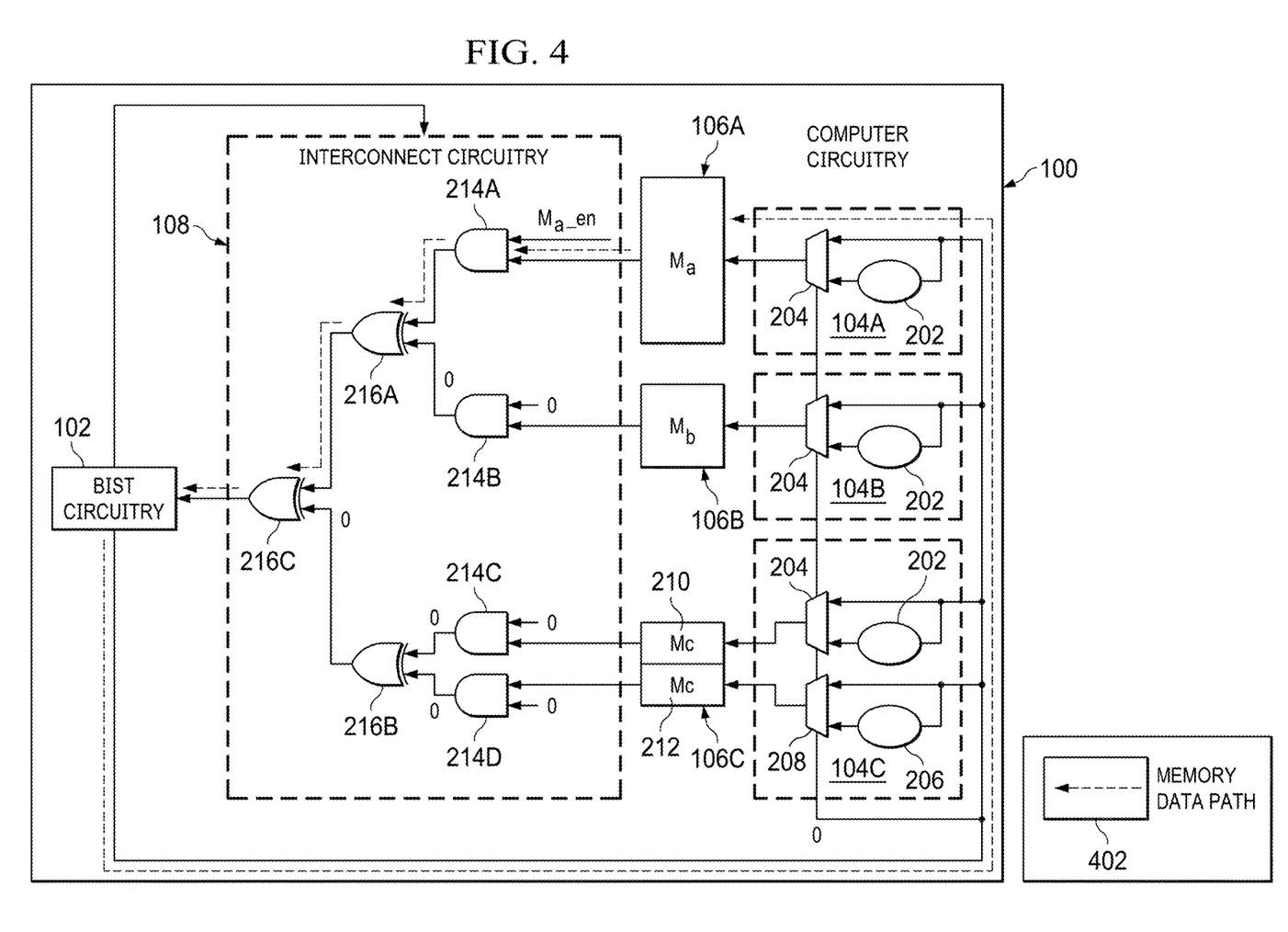
FIG. 4 is an illustrative example of the backwards compatibility of the computer circuitry of FIG. 1.

FIG. 4 is an illustrative example of the backwards compatibility of the computer circuitry of FIG. 1. FIG. 4 includes the example computer circuitry 100 and the memory data path 402. The example computer circuitry 100 includes the example BIST circuitry 102, the example converter circuitry 104A, 104B, 104C, the example memory 106A, 106B, 106C, and the example interconnect circuitry 108. The example converter circuitry 104A, 104B, 104C include the example format circuitry 202 and the example multiplexer circuitry 204. The example converter circuitry 104C further includes the example format circuitry 206 and the example multiplexer circuitry 208. The example memory 106C includes the example memory portions 210, 212. The example interconnect circuitry 108 includes the example AND gates 214A, 214B, 214C, 214D, and the example XOR gates 216A, 216B, 216C.

In some examples, the BIST circuitry 102 may receive a test that was designed for fault detection circuitry with a centralized architecture. For example, the test may expect that the BIST circuitry 102 will obtain values from the example memory 106A, 106B, 106C sequentially. In such examples, the BIST circuitry 102 may enter a backwards compatibility mode.

The illustrative example of FIG. 4 shows a first stage of the backwards compatibility mode, during which the BIST circuitry 102 only accesses memory values from the example memory 106A, During the first stage, the example BIST circuitry 102 may provide a '0' to each of the example multiplexer circuitry 204, 208 instances. As a result, each of the previous circuitry instances receive original, unconverted read instructions from the example BIST circuitry 102.

The instructions provided by the example BIST circuitry 102 while in a backwards compatibility mode are not provided in a uniform protocol as described in connection with FIGS. 1, 2, 3. Rather, the example BIST circuitry 102 may send instructions that are specifically formatted for memory 106A during the first stage. As a result, the example memory 106B, 106C may be unable to perform read operations based on instructions.

The example memory 106B, 106C may additionally or alternatively produce error codes in response to receiving improperly formatted instructions. To prevent error codes or other unwanted data output by the example memory 106B, 106C from being used during the first stage, the example BIST circuitry 102 may provide '0' bits to the AND gates 214B, 214C, 214D, thereby blocking the output.

In the example first stage, XOR gates 216A, 216C forward the results of the memory instruction from the example memory 106A to the example BIST circuitry 102 without any modifications. The example memory data path 402 illustrates the complete flow of data during the first stage of a backwards compatibility mode. Once the example BIST circuitry 102 receives the read results from the memory 106A and computes a partial signature, the BIST circuitry 102 may sequentially transition between stages of backwards compatibility. In each stage of backward compatibility, the example BIST circuitry 102 may provide instructions to obtain the memory results from a different one of the memory 106A, 106B, or memory portions 210, 212.

The example backwards compatibility mode illustrated in FIG. 4 enables the example fault detection circuitry 110 to accept instructions designed for previous solutions with centralized architectures and provide equivalent results. When not in backwards compatibility mode, the example fault detection circuitry 110 may accept tests designed to leverage the parallel computation and power safety threshold functionality as described in connection with FIGS. 1, 2, 3.

Figure 5:
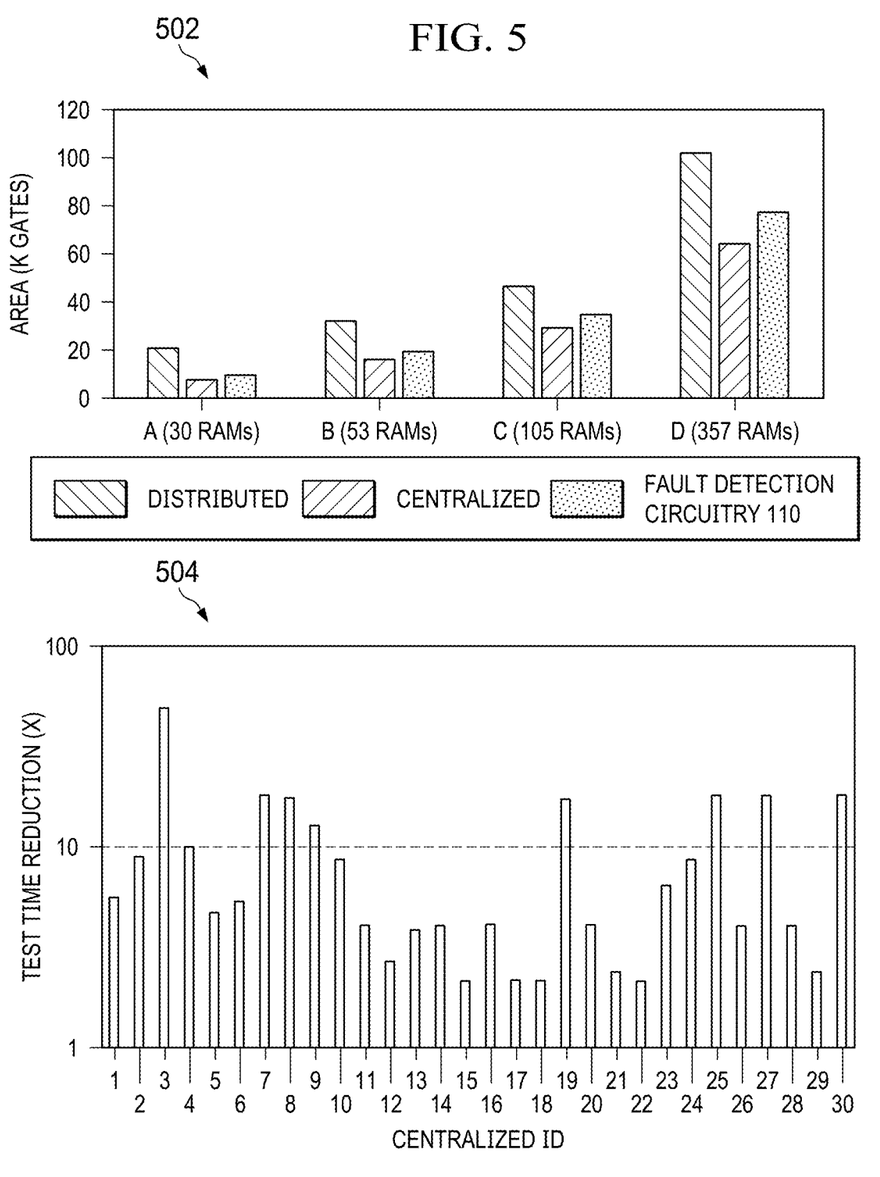
FIG. 5 shows two graphs illustrating the performance of the computer circuitry of FIG. 1 across multiple example simulations.

FIG. 5 shows two graphs illustrating the performance of the computer circuitry of FIG. 1 across multiple example simulations. FIG. 5 includes example graphs 502, 504.

The example graph 502 compares the implementation area required for the example fault identification circuitry to the implementation area required for previous solutions. On the y axis of the example graph 502, the implementation area is measured in thousands of logic gates. The implementation area of a previous example with a centralized architecture, a previous example with a distributed architecture, and the example fault detection circuitry 110 are compared for four different computer circuitry implementations. The x axis of the example graph 502 shows the number of different volatile memory circuits (RAMs) in each of the four computer circuitry implementations. The example graph 502 shows that, as the number of RAM circuits increases in the computer circuitry, each type of fault detection circuitry requires additional logic gates to map the memory to the one or more processor circuitry instances. The example graph 502 also shows that, on average, the example fault detection circuitry requires approximately 20% more gates than the previous solution with a centralized architecture and 30% less gates than the previous solution with a distributed architecture.

The example graph 504 compares the fault identification computation speed of the example computer circuitry 100 to 30 different computer circuitry implementations, each of which include a previous solution of fault detection with a centralized architecture. The x axis of the example graph 504 shows an index value assigned to each of the 30 different computer circuitry implementations. The y axis of the example graph 504 shows test time reduction, which measures how much faster the example fault detection circuitry 110 is at performing a test and accessing memory values than an indexed previous solution. The test time reduction may be computed by dividing the time required for a particular previous solution to perform a particular test and compute a particular signature by the time required for the example fault detection circuitry 110 to perform the same test and compute the same signature. The example graph 504 shows that, on average, the example fault detection circuitry 110 is approximately nine times faster than previous solutions of fault detection with a centralized architecture. The magnitude of the test reduction corresponding to a particular computer circuitry may be based in part on the number of parallel operations the computer circuitry can perform due to a power safety threshold.

Figure 6:
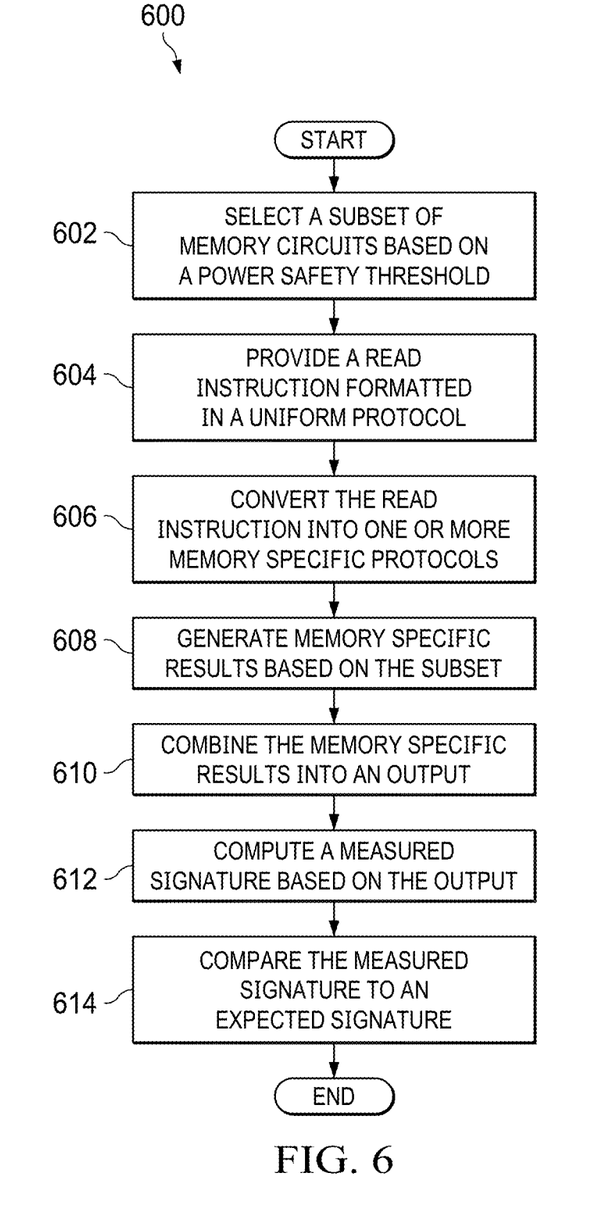
FIG. 6 is a flowchart representative of an example process that may be performed using machine readable instructions that can be executed and/or hardware configured to implement the computer circuitry of FIG. 1, and/or, more generally, the fault detection circuitry of FIG. 1 to identify faults in memory.

FIG. 6 is a flowchart representative of an example process that may be performed using machine readable instructions that can be executed and/or hardware configured to implement the computer circuitry of FIG. 1, and/or, more generally, the fault detection circuitry of FIG. 1 to identify faults in memory.

The example machine readable instructions and/or operations 600 begin when the example BIST circuitry 102 selects a subset of memory circuits based on a power safety threshold. (Block 602). The example BIST circuitry 102 may select a subset of the memory 106A, 106B, 106C so that the power safety threshold, which may limit the number of memory circuits that can actively performing read and write operations in parallel, is satisfied.

The example BIST circuitry 102 provides a read instruction formatted in a uniform protocol. (Block 604). The example BIST circuitry 102 provides the read instruction to each of the example converter circuitry 104A, 104B, 104C as part of a test to identify faults in the example memory 106A, 106B, 106C, The read instruction may include a valid identifier pattern which indicates which memory circuits are included in the subset of block 602.

One or more of the example converter circuitry 104A, 104B, 104C convert the read instruction into one or more memory specific protocols. (Block 606). The example converter circuitry 104A, 104B, 104C may parse the valid identifier pattern whether or not to convert the read instruction from the uniform protocol to the memory specific protocol. In some examples, only the converter circuitry instances that correspond to the memory circuits listed in the subset of block 602 convert the read instruction at block 606.

The example memory 106A, 106B, 106C generate memory specific results to the read instruction based on the subset of block 602. (Block 608). Specifically, only the subset of memory circuits identified in the subset of block 602 may receive the read instruction in a legible format (i.e., the memory specific protocol) that enables the memory circuit to produce a result. The remaining memory circuits may not receive the read instruction at all or may receive a read instruction in an illegible format (such as the uniform protocol).

The example interconnect circuitry 108 combines the memory specific results into an output. (Block 610). To combine the memory specific results into an output, the example AND gates 214A, 214B, 214C only allow provide outputs from memory circuits listed in the valid identifier pattern (i.e., memory circuits in the subset of block 602) to the example XOR gates 216A, 216B, 216C, The example AND gates 214A, 214B, 214C prevent any output from memory circuits not in the subset of block 602 from being used to identify faults. After receiving the one or more results of the read instruction from the AND gates 214A, 214B, 214C, the example XOR gates 216A, 216B, 216C combine the one or more results into a smaller amount of data (i.e., the output of block 610).

The example BIST circuitry 102 computes a measured signature based on the output. (Block 612). The measured signature may be a value that represents responses from each memory circuit in the subset of block 602.

The example BIST circuitry 102 compares the measured signature to an expected signature. (Block 614). The example BIST circuitry 102 compares the measured and expected signatures to identify faults in the memory circuits in the subset of block 602. In some examples, the example computer circuitry 100 may implement the operations described in the flow chart of FIG. 6 iteratively, with different memory circuits and/or different address chunks included in the valid identifier pattern each iteration. In doing so, the example computer circuitry 100 may produce multiple measured signatures such that all the example memory 106A, 106B, 106C are tested for faults. The example machine readable instructions and/or operations 600 end after block 614.

In this description, the term "and/or" (when used in a form such as A, B and/or C) refers to any combination or subset of A, B, C, such as: (a) A alone: (b) B alone: (c) C alone; (d) A with B: (e) A with C: (f) B with C: and (g) A with B and with C, Also, as used herein, the phrase "at least one of A or B" (or "at least one of A and B") refers to implementations including any of: (a) at least one A: (b) at least one B: and (c) at least one A and at least one B.

Example methods, apparatus and articles of manufacture described herein improve the computation time and implementation area of fault detection circuitry. Advantageously, example fault detection circuitry 110 enables parallel access of memory values while also implementing a single instance of processor circuitry (i.e., the example BIST circuitry 102). The example BIST circuitry 102 sends read instructions formatted with a uniform protocol to example memory 106A, 106B, 106C, which have different protocols. The example fault detection circuitry 110 includes example converter circuitry 104A, 104B, 104C to convert the instruction into a format usable by the corresponding specific type of memory. The example fault detection circuitry 110 also includes AND gates 214A, 214B, 214C, 214D to ensure the total number of parallel read operations satisfies a power safety threshold. The example fault detection circuitry 110 further includes XOR gates 216A, 216B, 216C to perform space compaction and provide data to the example BIST circuitry 102 for signature computation.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. Modifications are possible in the described embodiments, and other embodiments are possible, within the scope of the claims.

What is claimed is:

1. A device, comprising:
   converter circuitry configured to:
      receive an instruction formatted with a protocol; and
      convert the instruction from the protocol to a protocol specific to a first memory circuit of a plurality of memory circuits;
   logic circuitry configured to couple to the plurality of memory circuits, the logic circuitry configured to:
      receive a first result responsive to the instruction from the first memory circuit; and
      combine the first result with a second result from a second memory circuit of the plurality of memory circuits into an output; and
   a Built In Self Test (BIST) circuit configured to:
      determine a measured signature based on the output; and
      determine a fault in the plurality of memory circuits based on a comparison between the measured signature and an expected signature.

2. The device of claim 1, wherein the converter circuitry is configured to convert the instruction from the protocol to a protocol specific to the second memory circuit of the plurality of memory circuits.

3. The device of claim 2, wherein the first and second memory circuits are configured to generate the first and second results in parallel.

4. The device of claim 1, wherein:
   the logic circuitry includes first logic circuitry and second logic circuitry;
   the first logic circuitry is configured to:
      provide the first and second results to the second logic circuitry; and
      prevent the second logic circuitry from obtaining a third result from a third memory circuit of the plurality of memory circuits; and
   the second logic circuitry is configured to combine the first and second results to form the output.

5. The device of claim 1, wherein the BIST circuit is further configured to:
   identify a power safety threshold; and
   select the first and second results based on that a number of operations associated with receiving the first and second results from the first and second memory circuits satisfies the power safety threshold.

6. The device of claim 1, wherein:
   the protocol is compatible with a memory circuit with a single port;
   the first memory circuit includes two or more ports; and
   the protocol specific to the first memory circuit enables the first memory circuit to generate the first result based on the instruction corresponding to the protocol specific to the first memory circuit.

7. A method, comprising:
   receiving an instruction in a format; and
   converting the instruction from the format to a first instruction in a first format specific to a first memory circuit of a plurality of memory circuits;
   receiving a first result responsive to the first instruction from the first memory circuit;
   combining the first result with a second result from a second memory circuit of the plurality of memory circuits into an output;
   determining a measured signature based on the output; and
   determining a fault in the plurality of memory circuits based on the measured signature and an expected signature.

8. The method of claim 7, further including:
   converting the instruction from the format to a second instruction in a second format specific to the second memory circuit of the plurality of memory circuits.

9. The method of claim 8, further including providing the first and second instructions to the first and second memory circuits respectively in parallel.

10. The method of claim 7, further including:
    providing the first and second results to logic circuitry;
    preventing the logic circuitry from obtaining a third result from a third memory circuit of the plurality of memory circuits; and
    combining, with the logic circuitry, the first and second results to form the output.

11. The method of claim 7, further including:
    selecting the first and second results based on that a number of operations associated with receiving the first and second results from the first and second memory circuits satisfies a power safety threshold.

12. The method of claim 7, wherein:
    the format of the instruction is not compatible with the first memory circuit; and
    the first format of the first instruction is compatible with the first memory circuit.

13. A system, comprising:
    a plurality of memory circuits including a first memory circuit and a second memory circuit;
    converter circuitry configured to:
       receive an instruction to read data from the first and second memory circuits; and
       convert the instruction to a first instruction in a first format compatible with the first memory circuit and a second instruction in a second format compatible with the second memory circuit;
    logic circuitry configured to:
       receive the data from the first and second memory circuits responsive to the first and second instructions; and
       combine the data into an output; and
    a Built In Self Test (BIST) circuit configured to:
       determine a measured signature based on the output; and
       determine a fault in the plurality of memory circuits based on the measured signature and an expected signature.

14. The system of claim 13, wherein the logic circuitry comprises:
    first logic circuitry including:
       a first AND gate having an input configured to couple to the first memory circuit and an output;
       a second AND gate having an input configured to couple to the second memory circuit and an output; and a third AND gate having an input configured to couple to a third memory circuit of the plurality of memory circuits and an output; and second logic circuit including:
an XOR gate having a first input coupled to the output of the first AND gate and a second input coupled to the output of the third AND gate.

15. The system of claim 13, wherein the BIST circuit is further configured to:
determine to read the data from the first and second memory circuits based on that a number of operations associated with reading the data from the first and second memory circuits satisfies a power safety threshold.

16. The device of claim 1, wherein the instruction does not cause new data to be written to the first memory circuit.

17. The device of claim 1, wherein the first memory circuit and second memory circuits are different types of memory circuits.

18. The device of claim 1, wherein the instruction includes an identifier pattern that enables one or more specific memory circuits, not a remainder of the plurality of memory circuits, to generate results.

19. The device of claim 1, wherein the first memory circuit includes a first portion and a second portion, and wherein the second portion generates a result after that the first portion generates the first result.

20. The method of claim 7, wherein the first instruction is a read instruction.

* * * * *